United States Patent [19]
Toyoshima et al.

[11] 3,763,446
[45] Oct. 2, 1973

[54] HIGH FREQUENCY MULTI-RESONATOR OF TRAPPED ENERGY TYPE

[75] Inventors: Isao Toyoshima; Hideki Ishiyama; Kazuhiro Watanabe, all of Kyoto, Japan

[73] Assignee: Murata Manufacturing Co., Ltd., Otokuni-gun, Kyoto-fu, Japan

[22] Filed: Mar. 31, 1972

[21] Appl. No.: 239,942

[52] U.S. Cl. .................................... 333/72, 310/9.8
[51] Int. Cl. .......................... H03h 9/02, H03h 9/32
[58] Field of Search ................. 333/72, 30; 310/9.7, 310/9.8, 8.0, 8.1, 8.2, 8.3, 9.1, 9.4

[56] References Cited

UNITED STATES PATENTS

| | | | |
|---|---|---|---|
| 3,437,848 | 4/1969 | Borner et al. | 333/72 X |
| 3,396,327 | 8/1968 | Nakazawa | 333/72 |
| 3,423,700 | 1/1969 | Curran et al. | 333/72 |
| 2,943,279 | 6/1960 | Mattiat | 333/72 |
| 3,064,213 | 11/1962 | Mason | 333/72 X |
| 3,086,183 | 4/1963 | Schofer | 333/72 |
| 3,245,012 | 4/1966 | Schofer | 333/72 |
| 2,945,984 | 7/1960 | Yando | 333/72 X |
| 3,576,453 | 4/1971 | Mason | 310/8.2 |
| 3,559,116 | 1/1971 | Egerton et al. | 310/9.8 X |

*Primary Examiner*—Rudolph V. Rolinec
*Assistant Examiner*—Marvin Nussbaum
*Attorney*—Craig, Antonelli & Hill

[57] ABSTRACT

A high frequency piezoelectric multi-resonator of trapped energy type for use in an electric filter circuit comprises a thin wafer and two or more electrode units disposed on the wafer wherein a barrier for preventing vibrations from being transmitted from one of these electrode units to another through the wafer is provided for improving the spurious response characteristic of the multi-resonator.

15 Claims, 10 Drawing Figures

Patented Oct. 2, 1973

3,763,446

2 Sheets-Sheet 1

HIGH FREQUENCY MULTI-RESONATOR OF TRAPPED ENERGY TYPE

The present invention relates to a high frequency piezoelectric multi-resonator structure and, more particularly, to a high frequency piezoelectric multi-resonator of trapped energy type for use in an electric circuit.

An exemplary type of multi-resonator of similar character has been known as comprising a single thin wafer of monocrystalline or ceramic material having a vibrational mode producing a particle displacement in the plane of the wafer which is antisymmetrical about the center plane of the wafer, such vibrational modes including the thickness shear, thickness twist and torsional modes, and input and output electrodes of predetermined area on the opposed planar surfaces of the wafer to enable the resonator to be excited electromechanically in its principal vibratory mode so that, at the resonance condition, the maximum particle motion and wave propagation occurs.

Proceeding with the description in connection with the background of the present invention, reference is first made to FIG. 1 (A) and FIG. 1 (B) in which a prior art multi-resonator is shown by way of example, FIG. 1 (A) schematically illustrating one surface thereof while FIG. 1 (B) schematically illustrating the opposed surface thereof.

Referring to FIGS. 1 (A) and (B), the thin wafer 1 is provided on one planar surface with two pairs of input and output electrodes of each set, each of said two pairs being designated by arcuate-shaped electrodes 2*a* and 3*a* or 2*b* and 3*b*, and a pair of input and output terminals 5 and 6 respectively connected with the input and output electrodes 2*a* and 3*b* of the different electrode pairs by means of suitable wirings while the output and input electrodes 3*a* and 2*b* are connected with each other by means of suitable wiring, and also provided on the opposed planar surface with a pair of electrodes 4*a* and 4*b* connected with each other by means of suitable wiring through an intermediate terminal 7, curcularly-shaped electrodes 4*a* and 4*b* being respectively positioned in registration with the areas occupied by the two pairs of the electrodes 2*a*, 3*a* and 2*b*, 3*b* on the one planar surface of the wafer.

In this arrangement shown in FIGS. 1 (A) and 1 (B), it has been found that, during the operation of the resonator, resonant interaction often occurs berween the two electrode units resulting in an inferior spurious response characteristic. However, in order to maintain the same spurious response characteristic, the distance between the two electrode units must be of an increased value and, in which case, the size of the resonator structure has a tendency to become bulky with a reduction in the performance thereof.

Figure 1A:
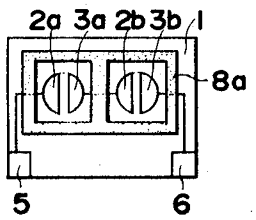
FIG. 1A PRIOR ART
Figure 1B:
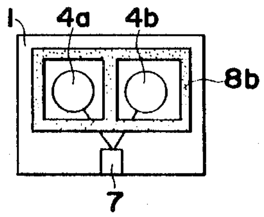
FIG. 1B PRIOR ART

To eliminate the above mentioned disadvantage inherent in a multi-resonator of the above construction, the provision of vibration absorbing members of a synthetic resin or viscous material, as indicated by 8*a* and 8*b* in FIG. 1(A) and 1(B), respectively has been proposed such as to reduce or substantially eliminate the resonant interaction between the two electrode units. In this case, the vibration absorbing members 8*a* and 8*b* are applied respectively on both planar surfaces of the wafer 1, so as to surround the two electrode units, substantially as shown in FIG. 1 (A) and (B) so that vibrations transmitted from one electrode unit to another through the wafer 1 during the operation therof are more or less obstructed by the vibration absorbing members. However, even this provision of the vibration absorbing members does not satisfactorily improve the spurious response characteristic of the resonator proper as compared with that of the present invention.

In addition, the application of a synthetic resin or viscous material for forming the vibration absorbing members 8*a* and 8*b* requires an additional and complicated process of manufacture. In other words, during this process of application of the synthetic resin or viscous material, variations in the width and/or thickness of the resin or viscous material applied to form the vibration absorbing members often brings about a varying amount of attenuation of the spurious responses and, hence, the inferior spurious response characteristic.

Accordingly, an essential object of the present invention is to provide an improved high frequency piezoelectric multi-resonator of the trapped energy type for use in an electric circuit capable of eliminating the above mentioned disadvantages with an improvement in the spurious response characteristic.

Another important object of the present invention is to provide the multi-resonator of the type above referred to characterized in the provisions of at least one elongated barrier of the length greater than the diameter of each of the electrode units between the two electrode units disposed on the wafer, by which transmission of vibrations from either of the electrode units to the other, i.e., the resonant interaction between said two electrode units, can be advantageously prevented.

A further object of the present invention is to provide the multi-resonator of the type above referred to including the elongated barrier which can be formed without substantially incurring the increased manufacturing cost, improving the spurious response characteristic.

It is to be noted that, according to the present invention, the multi-resonator herein proposed can be advantageously used as a single-frequency resonator for the control of a crystal oscillator and also as a drive for the monolithic crystal filter or like filter circuit.

Furthermore, according to the present invention, the elongated barrier for preventing the resonant interaction may be in the form of either an isolated slot or a slot extending from one edge of the wafer. Whatever the shape may be of the elongated barrier, this barrier according to the present invention can be formed by any suitable method heretofore largely executed, for example, by the use of a grinder or cutter having a rotary disc of which the periphery is provided with cutting element such as diamond.

Figure 2A:
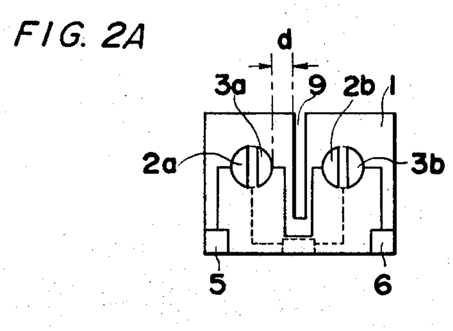
Figure 2B:
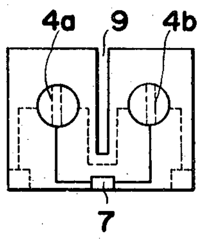
Figure 3:
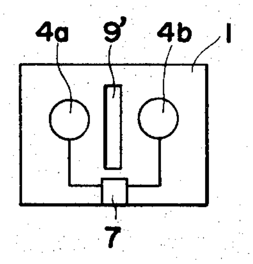
Figure 4:
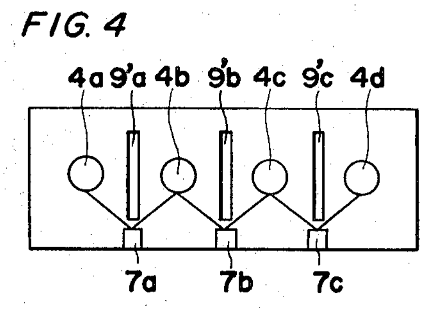
Figure 5:
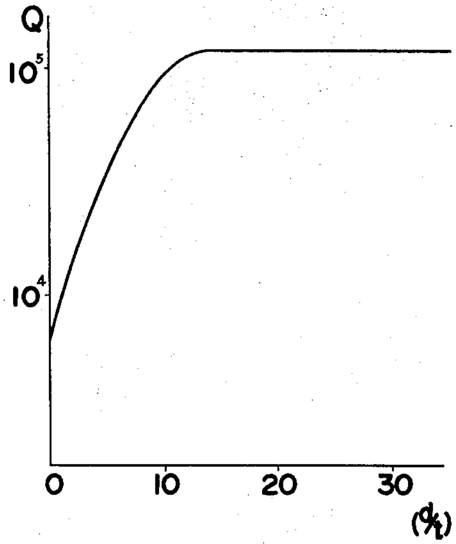
Figure 6:
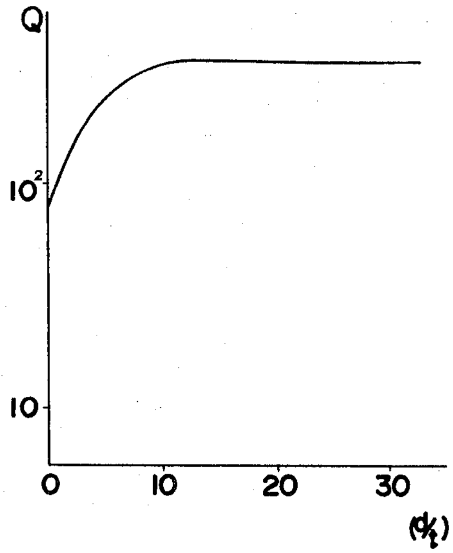
Figure 7:
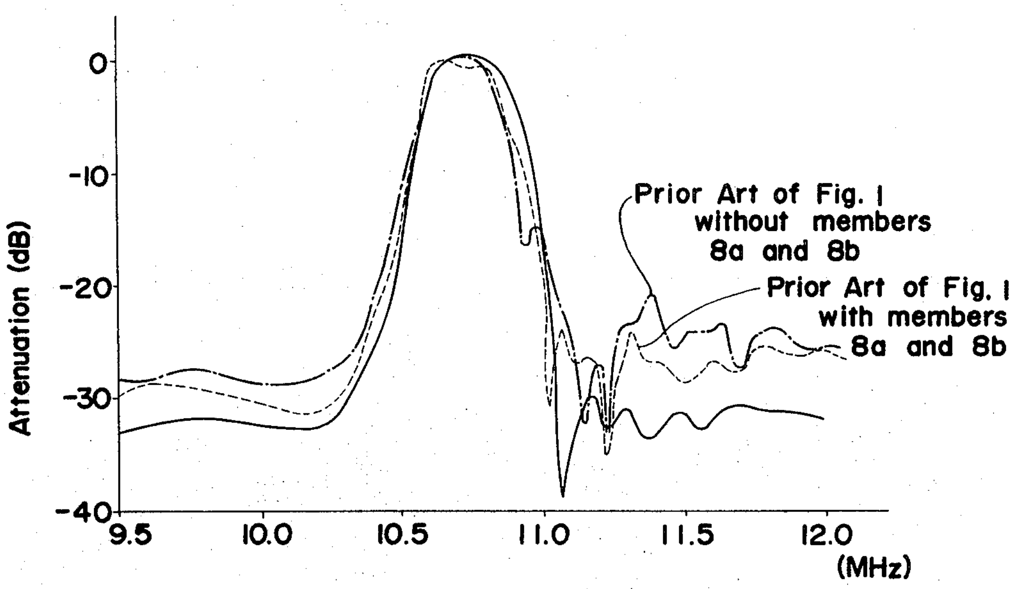
Figure 8:
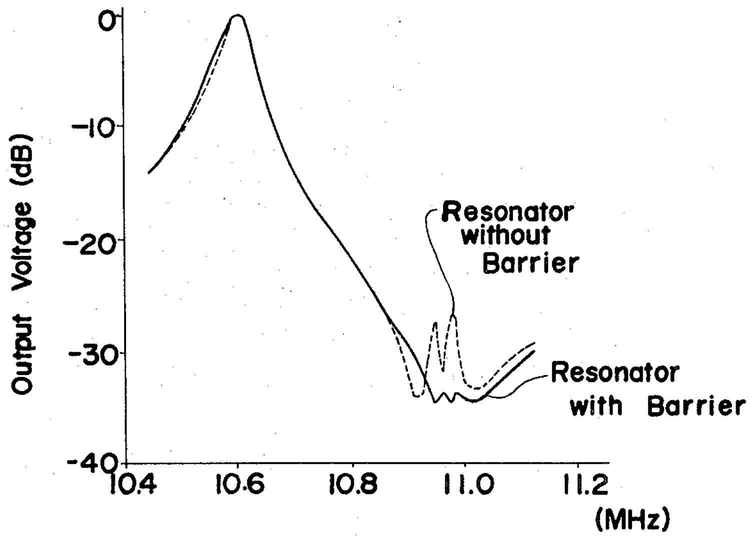

These and other objects and features of the present invention will become apparent from the following description of preferred embodiments thereof to be made with reference to the accompanying drawings, in which;

FIGS. 1 (A) and (B) are the schematic diagrams showing the opposed planar surfaces of the prior art multi-resonator structure, to which reference has been made in the foregoing description, FIGS. 2 (A) and (B) are schematic diagrams similar to those of FIGS. 1 (A) and (B) showing the multi-resonator constructed in accordance with the present invention, FIGS. 3 and 4 are schematic diagram each showing one planar surface of the multi-resonator modified in accordance with the present invention, FIGS. 5 and 6 are curves illustrating mechanical Q characteristics of the multi-resonator wherein the wafer comprises quartz and ceramic material respectively, FIG. 7 shows spurious response characteristic curves of the multi-resonators of FIGS. 1 and 2, and FIG. 8 is a curve showing the resonant characteristic of the multi-resonator with and without a barrier.

Before the description proceeds, it is to be noted that, for the sake of brevity, like reference numerals that have been used in connection with FIG. 1 are used throughout the several views of the accompanying drawings to designate like parts, and, therefore, description related with these reference numerals will be omitted in the following description.

Referring now to FIGS. 2 (A) and 2 (B) the wafer 1 is made of a known ceramic material such as lead zirconate-lead titanate, barium titanate or various chemical modifications thereof and includes the two electrode units, each of which is arranged in the manner as hereinbefore described and composed of a pair of input and output electrodes *2a* and *3a* or *2b* and *3b* and electrodes *4a* or *4b*. However, the number of the electrode units is not always limited to two, but may be more than two, such as shown in FIG. 4, depending upon the required design of an electric circuit in which the multi-resonator structure according to the present invention is used.

The barrier which is used in the present invention in place of the vibration absorbing members *8a* and *8b* shown in FIGS. 1 (A) and 1 (B) for preventing the wave propagation or resonant interaction between the two electrode units is shown by 9 as employed in the form of an elongated slot of preferably 0.5 mm, in width extending from one edge of the wafer 1 and terminating adjacent to the intermediate terminal 7 or adjacent to the opposed edge of the wafer 1 with a suitable distance spaced therefrom, an intermediate portion of the elongated slot being equally spaced from the both electrode units. However, as shown in FIG. 3, this barrier 9 may also be employed in the form of an isolated slot disposed in equally spaced relation to both electrode units with both its ends spaced from the corresponding edges of the wafer 1.

In any event, the length of the barrier 9 should be greater than the diameter of each of the electrode units, but smaller than the width of the wafer, i.e., the distance between the opposed edges of the wafer 1 within which the elongated slot 9 or isolated slot 9' extends.

Turning to FIG. 5, it will be seen that the ratio of the thickness $t$ of the wafer 1 to the minimum distance d (See FIG. 1 (A) ) between either of the electrode units to one of the opposed lengthwise edges of the elongated slot 9 or isolated slot 9' adjacent the electrode unit is preferably selected of such a value that the maximum mechanical Q can be obtained. In other words, in the event that quartz is employed for the wafer 1, this $d/t$ ratio may be more than approximately 12 as shown in FIG. 5 while, in the event that ceramic material is employed for the wafer 1, this $d/t$ ratio may be more than approximately 10 as shown in FIG. 6, although the maximum mechanical Q obtainable varies depending upon the type of material for the wafer 1.

In the multi-resonator structure of the arrangement as hereinabove described, it has been observed, as clearly shown in the graph of FIG. 7, that the attenuation of spurious responses at resonant frequencies other than the intrinsic resonant frequency is approximately −30dB as demonstrated by the full line and, hence, advantagesously greater than those of approximately −20dB and −23dB, as demonstrated by the chain line and the dotted line, respectively, which are afforded by the resonator structure of FIG. 1, with and without the vibration absorbing members *8a* and *8b*. It is also observed that the sharp-cut-off characteristic of a filter composed of the multi-resonator can be obtained.

Thus, from the foregoing description, it is clear that the multi-resonator structure according to the present invention is effective to provide an improved spurious response characteristic.

Furthermore, as shown in FIG. 8, even the resonant characteristic obtainable at resonant frequencies other than the intrinsic resonant frequency is advantageously improved as indicated by the full line while that of the multi-resonator having no barrier is indicated by the dotted line. In other words, the output voltage of spurious responses at resonant frequencies other than the intrinsic resonant frequency obtainable by the multi-resonator having the barrier is observed approximately −34dB while that of the multi-resonator having no barrier approximately −27dB and, accordingly, it is clear that the resonant characteristic of the multi-resonator having the barrier in accordance with the present invention is superior to that having no barrier.

Although the present invention has been fully disclosed in connection with the preferred embodiments thereof shown in the accompanying drawings, it is to be noted that various changes and modifications are apparent to those skilled in the art from the disclosure of the present invention. For example, although the barrier 9 or 9' has been described as in the form of the elongated or isolated slot, various forms of barrier such as a split ring-shaped opening may be employed. However, what is necessary is to prevent the resonant interaction between the electrode units. In addition thereto, the shape of each of the electrode units and/or the wafer may be circular. Accordingly, these changes and modifications should be construed as included within the scope of the present invention unless otherwise departing therefrom.

What we claim is:

1. A high-frequency multi-resonator of trapped energy type for use in an electric circuit comprising:

a thin wafer of piezoelectric material;

at least two spaced apart electrode units provided on said wafer; and a barrier formed in said wafer in the form of an elongated slot passing completely through said wafer and extending through an intermediate portion between said two electrode units so that a line from any position on one of said electrode units to any position on the other of said two electrode units is intersected by said slot, whereby a resonant interaction between said two electrode units during the operation of said multi-resonator can be reduced or substantially eliminated.

2. A high frequency multi-resonator as claimed in claim 1, wherein the width of said slot is approximately 0.5 mm.

3. A high frequency multi-resonator as claimed in claim 1, wherein said two electrode units are positioned on both sides of said slot in equally spaced relationship with respect to said slot.

4. A high-frequency multi-resonator as claimed in claim 1, wherein each electrode unit comprises a first circularly shaped electrode element disposed on one surface of said wafer and a second circularly shaped electrode element of the same diameter as said first element disposed opposite said first element on the other side of said wafer therefrom, said second element having a separating gap therein, so as to be formed of a pair of arcuate-shaped electrodes separated from each other on said other side of said first electrode element and wherein the length of the slot is greater than the diameter of any one of the electrode units.

5. A high frequency multi-resonator as claimed in claim 1, wherein the minimum distance between one of the electrode units to one of the lengthwise edges of the slot adjacent to said one of said electrode units is such that a ratio of the thickness of the wafer to said minimum distance is preferably more than 10.

6. A high frequency multi-resonator as claimed in claim 1, wherein the number of said slots is more than two.

7. A high frequency multi-resonator as claimed in claim 1, wherein said slot is formed by the use of a cutting machine having a rotary disc of the thickness substantially equal to the width of said barrier.

8. A high frequency multi-resonator as claimed in claim 5, wherein said wafer is made of ceramic material.

9. A high frequency multi-resonator according to claim 1, wherein said slot is an elongated slot extends from one edge of said wafer to a portion thereof separated from said one edge and adjacent a second edge opposite said one edge.

10. A high frequency multi-resonator as claimed in claim 1, wherein said slot extends between portions of said wafer adjacent the opposed edges thereof.

11. A high frequency multi-resonator as claimed in claim 1, wherein said electrode units are circularly shaped and said slot is elongated and has a length greater than the diameter of an electrode unit.

12. A high frequency multi-resonator as claimed in claim 1, wherein said slot is in the form of a ring-shaped opening.

13. A high frquency multi-resonator as claimed in claim 1, wherein said wafer is circularly shaped.

14. A high frequency multi-resonator as claimed in claim 13, wherein said electrode units are circularly shaped.

15. A high-frequency multi-resonator as claimed in claim 4, further including first electrical conductive means disposed on said one surface of said wafer for electrically connecting said first circularly shaped electrode elements together and second electrical conductive means disposed on said other surface of said wafer for electrically connecting the electrodes of said pairs making up said second electrode elements which are arranged opposite each other on either side of said slot.

* * * * *